(12) United States Patent
Niimi et al.

(10) Patent No.: US 9,054,056 B2
(45) Date of Patent: Jun. 9, 2015

(54) TRANSISTOR PERFORMANCE USING A TWO-STEP DAMAGE ANNEAL

(71) Applicant: Texas Instruments Incorporated, Dallas, TX (US)

(72) Inventors: Hiroaki Niimi, Austin, TX (US); Jarvis Benjamin Jacobs, Murphy, TX (US); Ajith Varghese, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/451,489

(22) Filed: Aug. 5, 2014

(65) Prior Publication Data
US 2014/0339609 A1 Nov. 20, 2014

Related U.S. Application Data

(62) Division of application No. 11/742,229, filed on Apr. 30, 2007, now Pat. No. 8,828,855.

(51) Int. Cl.
| H01L 21/469 | (2006.01) |
| H01L 21/324 | (2006.01) |
| H01L 21/265 | (2006.01) |
| H01L 21/8234 | (2006.01) |
| H01L 29/66 | (2006.01) |
| H01L 29/10 | (2006.01) |

(52) U.S. Cl.
CPC ........ *H01L 21/324* (2013.01); *H01L 21/26513* (2013.01); *H01L 21/823462* (2013.01); *H01L 29/105* (2013.01); *H01L 21/265* (2013.01); *H01L 21/823412* (2013.01); *H01L 29/66477* (2013.01)

(58) Field of Classification Search
CPC .................................................... H01L 21/324
USPC .................................. 438/530, 797, 775, 795
See application file for complete search history.

(56) References Cited

U.S. PATENT DOCUMENTS

| 5,950,096 | A | 9/1999 | Huang et al. |
| 5,998,277 | A | 12/1999 | Wu |
| 6,309,952 | B1 * | 10/2001 | Ridley et al. .................. 438/530 |
| 2001/0017294 | A1 | 8/2001 | Aoki et al. |
| 2005/0245019 | A1 | 11/2005 | Luo et al. |
| 2006/0172488 | A1 | 8/2006 | Fujishima et al. |
| 2007/0004146 | A1 | 1/2007 | Prinz et al. |
| 2007/0080373 | A1 * | 4/2007 | Tamaki ........................ 257/204 |
| 2007/0122971 | A1 * | 5/2007 | Dobuzinsky et al. ......... 438/257 |

* cited by examiner

*Primary Examiner* — Bradley K Smith
(74) *Attorney, Agent, or Firm* — Jacqueline J. Garner; Frank Cimino

(57) ABSTRACT

A two-step thermal treatment method consists of performing ion implantation in a silicon substrate of the semiconductor device. A first thermal treatment procedure is performed on the semiconductor device. A second thermal treatment procedure is consecutively performed on the semiconductor device to reduce damage produced by the ion implantation.

3 Claims, 2 Drawing Sheets

TRANSISTOR PERFORMANCE USING A TWO-STEP DAMAGE ANNEAL

CROSS REFERENCE TO RELATED APPLICATIONS

This application is a divisional of U.S. Nonprovisional patent application Ser. No. 11/742,299, filed Apr. 30, 2007, the contents of which are herein incorporated by reference in its entirety.

FIELD OF THE INVENTION

The subject matter of this invention relates to methods of high temperature thermal treatment. More particularly, the subject matter of this invention relates to methods of healing ion-implantation related damage to improve core gate transistor performance.

BACKGROUND OF THE INVENTION

Ion implantation causes degradation of electrical properties, such as mobility and minority carrier lifetime. Measures must be taken to heal some or all this ion implanted-related damage. A method of healing such ion implanted-related damage includes thermal treatment at proper conditions, i.e., temperature, time, and ambient gas. In a conventional CMOS process flow, after shallow trench isolation (STI) formation and before input/output (I/O) gate oxide formation, there are several ion implantation steps. Ion implantation steps include, e.g., threshold voltage adjustment, channel stop, and well implantation. The ion implantation process introduces damage in the core active area which degrades transistor performance and reliability.

One method to heal the ion-implant related damage is to use thermal treatment. This thermal treatment is performed prior to the I/O gate oxide formation. Typical conditions to heal the ion-implant related damage are 1050° C. in $N_2/O_2$ for approximately 30 seconds. However, as devices dimensions are scaled downward, more effort is required to optimize thermal treatments to further improvement device performance and reliability.

Accordingly, the present invention solves these and other problems of the prior art ion-implantation related damage to a core gate of a transistor.

SUMMARY OF THE INVENTION

In accordance with the present teachings, a method of thermal treating a semiconductor device is disclosed including a step of performing ion implantation in a silicon substrate of the semiconductor device. A first thermal treatment procedure is performed on the semiconductor device. A second thermal treatment procedure is performed consecutively on the semiconductor device to reduce damage produced by the ion implantation.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

The teachings described herein are directed toward a two-step damage anneal that improves core gate transistor performance. Ion implantation-related defect density in the core area is reduced via (1) 1050° C. $N_2/O_2$ anneal followed by 1100° C. $O_2/N_2$ thermal oxidation, (2) 1050° C. $N_2/O_2$ anneal followed by 1100° C. $O_2/H_2$ thermal oxidation, and (3) 1050° C. $N_2/O_2$ anneal followed by 1100° C. $N_2/H_2$ thermal treatment. Since ion implantation introduces damage in a Si substrate and thereby degrades transistor performance, thermal treatment is needed to recover from such damage. The teachings disclosed herein provide for thermal procedures to reduce ion implantation damage and therefore improve electrical performance, especially mobility.

Figure 1:
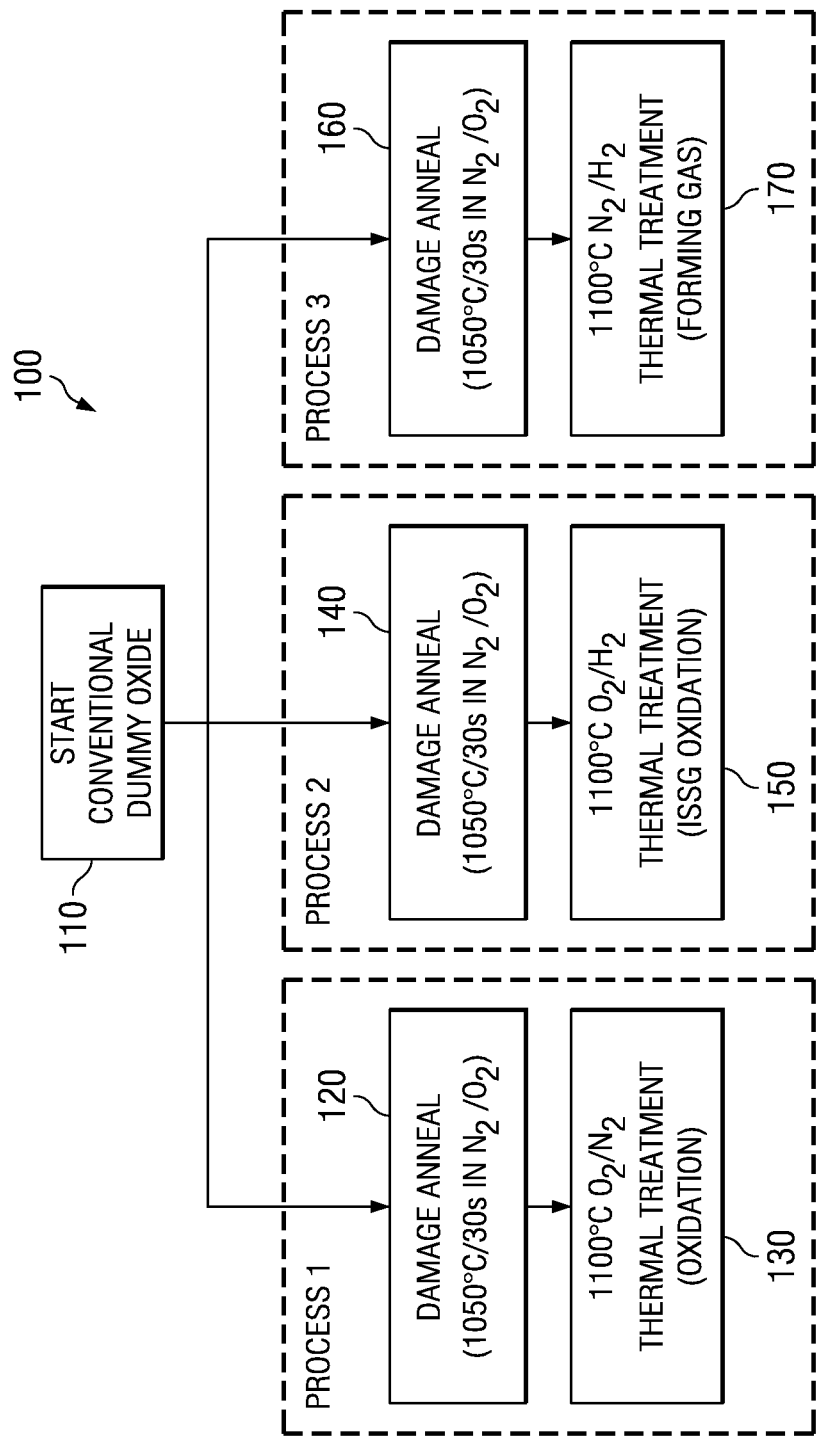
FIG. 1 shows the process steps for reducing ion-implantation core damage, in accordance with the principles of the present teachings.

To supplement a conventional process thermal treatment step, a novel 2nd-step damage thermal treatment, i.e., anneal, can be performed to heal ion-implantation related damage prior to I/O gate dielectrics formation. FIG. 1 shows the process steps for reducing ion-implantation core damage, in accordance with the principles of the present teachings.

Step 110 shows the beginning of the process to reducing ion-implantation core damage. The process starts with the creation of a conventional dummy oxide such as, e.g., $SiO_2$. Such a conventional dummy oxide can be created using conventional furnace oxidation at a relatively low 850-950° C.

Step 120 shows conventional damage thermal treatment including, e.g., 1050° C. in $N_2/O_2$ for approximately 30 seconds. However, to reduce ion implantation damage a second thermal treatment step 130 is performed. The second thermal treatment step 130 includes a 1100° C. $O_2/N_2$ thermal treatment for, e.g., approximately 10 seconds.

Step 140 shows conventional damage thermal treatment including, e.g., 1050° C. in $N_2/O_2$ for approximately 30 seconds. However, to reduce ion implantation damage a second thermal treatment step 150 is performed. The second thermal treatment step 150 includes a 1100° C. $O_2/H_2$ thermal treatment for, e.g., approximately 10 seconds.

Step 160 shows conventional damage thermal treatment including, e.g., 1050° C. in $N_2/O_2$ for approximately 30 seconds. However, to reduce ion implantation damage a second thermal treatment step 170 is performed. The second thermal treatment step 170 includes a 1100° C. $N_2/H_2$ thermal treatment for, e.g., approximately 10 seconds.

Steps 120, 130, 140, 150, 160 and 170 can be performed either in the alternative or in any combination that allows for adequate healing of ion implantation-related damage during, e.g., a high temperature in-situ steam generation (ISSG) oxidation process. Moreover, the $2^{nd}$ step of the 2-step damage thermal treatment process disclosed herein are performed consecutively, i.e., in regular succession without gaps. Thus, the 2-step damage thermal treatment process disclosed herein heals ion-implantation related damage and leads to improved transistor performance, especially mobility.

FIGS. 2A-2G show the process steps to create a core gate dielectric formation, in accordance with the principles of the present teachings.

Figure 2A:
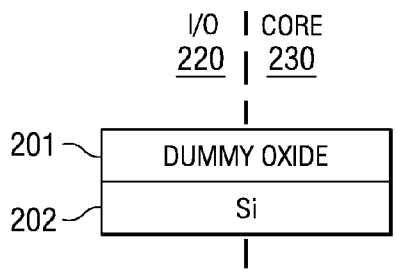
FIGS. 2A-2G show the process steps to create a core gate dielectric formation, in accordance with the principles of the present teachings.

In particular, FIG. 2A shows a conventional step of forming a dummy oxide 201 over a Si substrate 202. An example of a process to form dummy oxide 201 is a thermal dry atmospheric pressure $SiO_2$ process to produce a thickness of approximately ~75 A. An example of a Si substrate 202 is a <100> p type substrate.

Figure 2B:
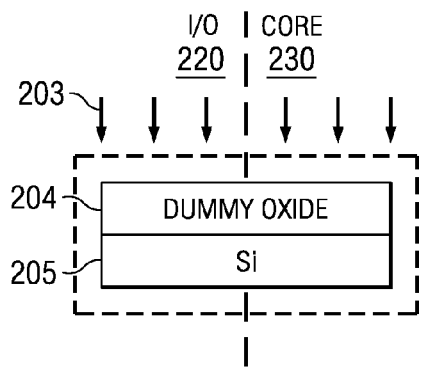

FIG. 2B shows a 2-step damage thermal treatment 203, disclosed in FIG. 1 in accordance with the principles of the present teachings. The 2-step damage thermal treatment 203 can be performed on the dummy oxide 204 over Si substrate 205 formation in both an I/O region 220 and a core region 230.

Figure 2C:
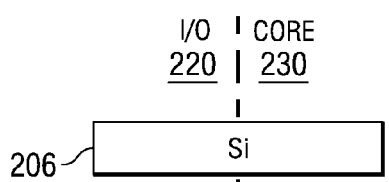

FIG. 2C shows a deglazing step. In particular, dummy oxide 204 from FIG. 2B is removed from both the I/O region 220 and the core region 230 through deglazing. Subsequent to deglazing, only the Si substrate 206 remains. Deglazing can include, e.g., wet etching of the dummy oxide 202 using HF based chemistry.

Figure 2D:
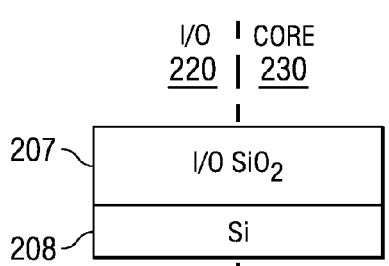

FIG. 2D shows a step of I/O furnace oxidation of the Si substrate 206. In particular, an I/O $SiO_2$ layer 207 is formed over the Si substrate 208 in an I/O region 220 and a core region 230. Example furnace parameters are 800° C. $O_2$ based dry oxidation.

Figure 2E:
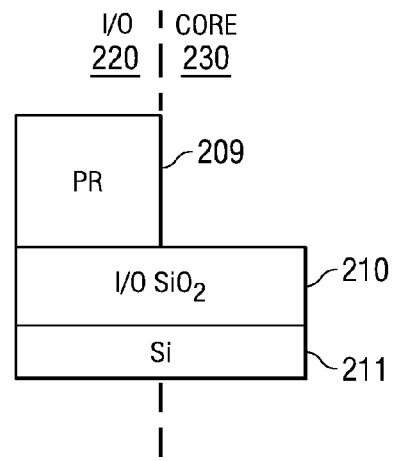

FIG. 2E shows a step of forming a photoresist (PR) coat within an I/O region. In particular, PR coat 209 is formed in the I/O region 220 only over I/O $SiO_2$ layer 210. $SiO_2$ layer 210 remains over Si substrate 211. Formation of the PR coat 209 within only the I/O region 220 can be performed through conventional photomask and etching techniques.

Figure 2F:
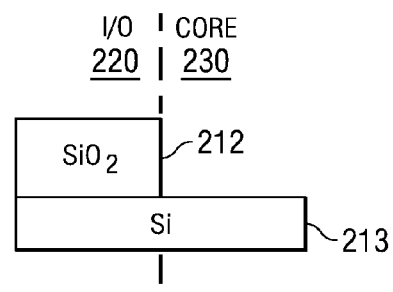

FIG. 2F shows a step of deglazing of an oxide from a core area and removal of a PR coat. In particular, PR coat 209 from FIG. 2E is removed and the $SiO_2$ layer 210 from FIG. 2E only from core region 230 is removed. The result in the $SiO_2$ layer 212 remaining in the I/O region 220 over the Si substrate 213. Removal of the $SiO_2$ layer 210 from FIG. 2E from only the core region 230 can be performed through conventional photomask and etching techniques.

Figure 2G:
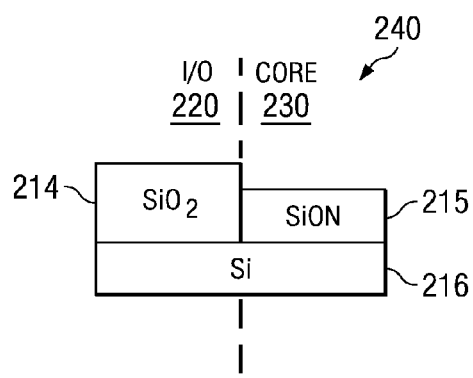

FIG. 2G shows a step of core gate dielectric formation. In particular, plasma nitridation can be used to create the SiON layer 215 in the core region 230. Upon final formation of the core gate dielectric formation, $SiO_2$ layer 214 is formed in the I/O region 220 over the Si substrate 216 and the SiON layer 2215 is formed in the core region 230 over the Si substrate 216.

Thus, core gate dielectric formation 240 is formed in accordance with the 2-step damage thermal treatment disclosed herein that heals ion-implantation related damage and leads to improved transistor performance, especially mobility.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a semiconductor device, comprising:
    performing ion implantation into a silicon substrate of the semiconductor device, wherein said ion implantation introduces damage in a core active area of the silicon substrate;
    after performing the ion implantation, reducing said damage in the core active area of the silicon substrate using a two-step thermal treatment including:
        performing a first thermal treatment procedure on the semiconductor device, wherein the first thermal treatment procedure comprises a $N_2$ and $O_2$ based anneal at a first temperature and a first duration; and
        consecutively performing a second thermal treatment procedure using at least one process condition distinct from said first thermal treatment on the semiconductor device, wherein the first thermal treatment procedure and the second thermal treatment procedure are performed prior to forming any gate dielectric, and wherein the second thermal treatment is a thermal treatment in $N_2$ and $H_2$ performed at a second temperature distinct from said first temperature and a second duration; and
    after reducing the damage using the two-step thermal treatment, forming an I/O gate dielectric and forming a core gate dielectric, wherein the I/O gate dielectric comprises silicon dioxide and the core gate dielectric comprises silicon oxynitride.

2. A method of fabricating a semiconductor device, comprising:
    performing ion implantation into a silicon substrate of the semiconductor device, wherein said ion implantation introduces damage in a core active area of the silicon substrate;
    after performing the ion implantation, reducing said damage in the core active area of the silicon substrate using a two-step thermal treatment including:
        performing a first thermal treatment procedure on the semiconductor device, wherein the first thermal treatment procedure comprises a $N_2$ and $O_2$ based anneal at a first temperature and a first duration; and consecutively performing a second thermal treatment procedure using at least one process condition distinct from said first thermal treatment on the semiconductor device, wherein the first thermal treatment procedure and the second thermal treatment procedure are performed prior to forming any gate dielectric, and wherein the second thermal treatment is a thermal treatment in $N_2$ and $H_2$ performed at a second temperature distinct from said first temperature and a second duration; and after reducing the damage using the two-step thermal treatment, forming an I/O gate dielectric and forming a core gate dielectric, wherein the step of forming the I/O gate dielectric and core gate dielectric comprises the steps of:

forming an I/O gate dielectric on the silicon substrate;

removing a portion of the I/O gate dielectric over the core active area; and then, forming the core gate dielectric over the core active area.

3. A method of fabricating a semiconductor device, comprising:

forming a dummy oxide on a surface of a silicon substrate of the semiconductor device;

performing ion implantation into the silicon substrate, wherein said ion implantation introduces damage in a core active area of the silicon substrate;

after performing the ion implantation, removing at least a portion of said damage from the core active area of the silicon substrate using a two-step thermal treatment including:

performing a first thermal treatment procedure on the semiconductor device, wherein the first thermal treatment procedure comprises a $N_2$ and $O_2$ based anneal at a first temperature and a first duration of approximately 30 seconds; and consecutively performing a second thermal treatment procedure using at least one process condition distinct from said first thermal treatment on the semiconductor device, wherein the first thermal treatment procedure and the second thermal treatment procedure are performed prior to forming any gate dielectric, and wherein the second thermal treatment is a thermal treatment in $N_2$ and $H_2$ performed at a second temperature distinct from said first temperature and a second duration of approximately 10 seconds;

performing a deglaze process to remove the dummy oxide; and after performing the deglaze process, forming an I/O gate dielectric and forming a core gate dielectric.

* * * * *